United States Patent
Tang

(10) Patent No.: US 11,296,130 B2
(45) Date of Patent: Apr. 5, 2022

(54) SIDE-BONDING STRUCTURE OF DISPLAY PANEL AND MANUFACTURING METHOD THEREOF

(71) Applicant: SHENZHEN CHINA STAR OPTOELECTRONICS SEMICONDUCTOR DISPLAY TECHNOLOGY CO., LTD., Shenzhen (CN)

(72) Inventor: Aihua Tang, Shenzhen (CN)

( * ) Notice: Subject to any disclaimer, the term of this patent is extended or adjusted under 35 U.S.C. 154(b) by 74 days.

(21) Appl. No.: 16/755,572

(22) PCT Filed: Feb. 28, 2020

(86) PCT No.: PCT/CN2020/077199
§ 371 (c)(1),
(2) Date: Apr. 11, 2020

(87) PCT Pub. No.: WO2021/138985
PCT Pub. Date: Jul. 5, 2021

(65) Prior Publication Data
US 2021/0210530 A1    Jul. 8, 2021

(51) Int. Cl.
*H01L 27/12* (2006.01)
*H01L 27/32* (2006.01)
*G02F 1/1333* (2006.01)
*G02F 1/1345* (2006.01)

(52) U.S. Cl.
CPC ...... *H01L 27/1262* (2013.01); *H01L 27/1218* (2013.01); *G02F 1/1333* (2013.01); *G02F 1/1345* (2013.01); *H01L 27/3272* (2013.01)

(58) Field of Classification Search
CPC .............. H01L 27/124; H01L 27/1218; H01L 27/1262; H01L 27/3272; G02F 1/1333; G02F 1/1345
See application file for complete search history.

(56) References Cited

U.S. PATENT DOCUMENTS

| 10,401,560 B2* | 9/2019 | Kawata | G02F 1/134309 |
| 11,156,889 B1* | 10/2021 | Qiu | G02F 1/13398 |
| 2017/0017108 A1* | 1/2017 | Shin | G02F 1/13458 |
| 2018/0067354 A1* | 3/2018 | Son | H05K 1/189 |
| 2019/0204669 A1* | 7/2019 | Lee | H01L 23/498 |

(Continued)

FOREIGN PATENT DOCUMENTS

| CN | 108153070 A | 6/2018 |
| CN | 109426018 A | 3/2019 |

(Continued)

*Primary Examiner* — Mohsen Ahmadi

(57) ABSTRACT

The present application provides a display panel and a manufacturing method thereof. The display panel includes a first substrate, a plurality of bonding pads, an insulating adhesive, a sealant, a blocking layer, a second substrate, and a chip on film (COF). The display panel of the present application effectively reduces an area of a non-display region of a display panel in the prior art by side-bonding the COF and realizes an ultra-narrow bezel display with a width of the non-display region being less than 1 mm. Meanwhile, through a configuration of the blocking layer, the conductive adhesive can be prevented from overflowing and causing short circuits between each of the plurality of bonding pads.

16 Claims, 5 Drawing Sheets

(56) References Cited

U.S. PATENT DOCUMENTS

2020/0029439 A1* 1/2020 Zhang .................... H05K 3/321
2020/0035936 A1* 1/2020 Zhou ................... H01L 51/5237
2020/0403012 A1   12/2020 Ma et al.
2021/0333591 A1* 10/2021 Du .................... G02F 1/133331

FOREIGN PATENT DOCUMENTS

| CN | 110007534 A | 7/2019 |
|----|-------------|--------|
| CN | 110277018 A | 9/2019 |

* cited by examiner

SIDE-BONDING STRUCTURE OF DISPLAY PANEL AND MANUFACTURING METHOD THEREOF

FIELD OF APPLICATION

The present application is related to the field of display panel technology, and specifically, to a side-bonding structure of a display panel and a manufacturing method thereof.

BACKGROUND OF APPLICATION

With advancement of technology, electronic products such as smart phones, tablets, and wearable devices are gradually becoming popular, and all of these devices require a display panel. A display panel includes a display region and a non-display region. In order to meet a so-called full-screen display in the market and obtain a larger screen size within a limited device volume, the display region of the display panel should be maximized, while an area of the non-display region should be minimized.

In a traditional display panel, a driving chip of the display panel is directly disposed on a substrate of the display panel, which is called chip on glass (COG) process. Because the driver chip is set on a periphery of the display panel, this region cannot be used as a display region, and the non-display region of the display panel using the COG process is larger and a bezel of the display panel is also thicker.

A chip on film (COF) process improves the former technology by disposing a driving circuit on the non-display region of the traditional display panel on a flexible circuit board connected to the display panel, so that an area of the non-display region can be appropriately reduced.

SUMMARY OF APPLICATION

A COF process can appropriately reduce an area of a non-display region of a display panel, but the non-display panel still needs to remain a region for bonding circuit pins of a flexible circuit board, which limits a reduction limit of the non-display region. Therefore, there is a need for a bonding structure or technology which improves the COF process to solve the reduction limit of the non-display region in the prior art. Accordingly, a smaller non-display region can be obtained, and an ultra-narrow bezel can be realized.

In order to solve the problem above, the present application provides a display panel, including a first substrate, a plurality of bonding pads, an insulating adhesive, a sealant, a blocking layer, a second substrate, and a chip on film (COF). The first substrate includes a thin-film transistor, a display region, and a non-display region outside the display region. The plurality of bonding pads are disposed on the non-display region of the first substrate, and the plurality of bonding pads are electrically connected to the thin-film transistor and extend to a side of the first substrate. The insulating adhesive is coated on the plurality of bonding pads. The sealant is coated on the first substrate along a boundary line between the display region and the non-display region. The blocking layer is disposed on the insulating adhesive. The second substrate is disposed on the sealant. The side of the first substrate, a side of the plurality of bonding pads, a side of the insulating adhesive, a side of the blocking layer, and a side of the second substrate are coplanar.

In the display panel of the present application, the COF is disposed on the side of the first substrate, the side of the plurality of bonding pads, the side of the insulating adhesive, the side of the blocking layer, and the side of the second substrate, which are coplanar. The COF includes an anisotropic conductive film coated with a conductive adhesive. The COF is bonded to the side of the plurality of bonding pads through the conductive adhesive and the anisotropic conductive film. Each of the plurality of bonding pads is electrically connected to a corresponding circuit on the COF. When the COF is bonded to the side of the plurality of bonding pads, the blocking layer prevents the conductive adhesive from overflowing and makes a circuit of each of the plurality of bonding pads be insulated from each other.

In the display panel of the present application, the side of the first substrate, the side of the plurality of bonding pads, the side of the insulating adhesive, the side of the blocking layer, and the side of the second substrate include a flat surface.

In the display panel of the present application, the blocking layer of an embodiment is a polystyrene layer.

In the display panel of the present application, material of the blocking layer in another embodiment is same as material of the sealant, and the sealant covers the non-display region.

In the display panel of the present application, the insulating adhesive is a tuffy blue glue.

In the display panel of the present application, the conductive adhesive is a silver paste.

The present application further provides a manufacturing method of a display panel, including the steps of:

step S10: providing a first substrate including a thin-film transistor, a display region, and a non-display region outside the display region;

step S20: forming a plurality of bonding pads on the non-display region of the first substrate, wherein the plurality of bonding pads are electrically connected to the thin-film transistor and extend to a side of the first substrate;

step S30: coating an insulating adhesive on the plurality of bonding pads;

step S40: coating a sealant on the first substrate along a boundary line between the display region and the non-display region;

step S50: forming a blocking layer on the insulating adhesive; and step S60: disposing a second substrate on the sealant;

wherein the side of the first substrate, a side of the plurality of bonding pads, a side of the insulating adhesive, a side of the blocking layer, and a side of the second substrate are coplanar.

In the manufacturing method of the display panel, further including the steps of:

step S70: attaching a chip on film (COF) on the side of the first substrate, the side of the plurality of bonding pads, the side of the insulating adhesive, the side of the blocking layer, and the side of the second substrate, which are coplanar;

wherein the COF includes an anisotropic conductive film coated with a conductive adhesive, the COF is bonded to the side of the plurality of bonding pads through the conductive adhesive and the anisotropic conductive film, and each of the plurality of bonding pads is electrically connected to a corresponding circuit on the COF. When the COF is bonded to the side of the plurality of bonding pads, the blocking layer prevents the conductive adhesive from overflowing and makes a circuit of each of the plurality of bonding pads be insulated from each other.

In the manufacturing method of the display panel, the side of the first substrate, the side of the plurality of bonding pads, the side of the insulating adhesive, the side of the blocking layer, and the side of the second substrate are grinded or cut to form a flat surface.

In the manufacturing method of the display panel, the step S50 of an embodiment further includes the step of:

step S51: coating a polystyrene layer on the insulating adhesive to form the blocking layer.

In the manufacturing method of the display panel, the step S50 of another embodiment further includes the step of:

step S51: coating the sealant of step S40 on the insulating adhesive to form the blocking layer and cover the non-display region.

In the manufacturing method of the display panel, the insulating adhesive is a tuffy blue glue.

In the manufacturing method of the display panel, the conductive adhesive is a silver paste.

The display panel of the present application effectively reduces an area of a non-display region of a display panel in the prior art by side-bonding the COF, and realizes an ultra-narrow bezel display with a width of the non-display region being less than 1 mm. Meanwhile, through a configuration of the blocking layer, the conductive adhesive can be prevented from overflowing and causing short circuits between each of the plurality of bonding pads.

DETAILED DESCRIPTION OF PREFERRED EMBODIMENTS

The features and spirit of the present application are described more clearly by the following detailed description of preferred embodiments, rather than limiting the scope of the present application with the disclosed preferred embodiments. On the contrary, the present application is to cover various changes and equivalent arrangements within the scope of claims of the present application.

Figure 1:
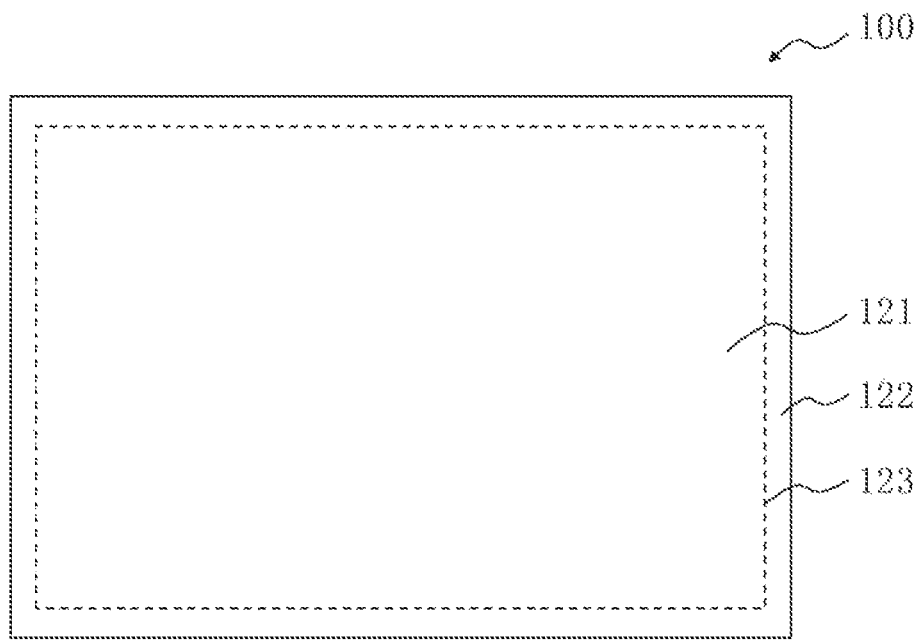
FIG. 1 is a top-view structural diagram of a first substrate of an embodiment of the present application.

Please refer to FIG. 1. In a display panel of an embodiment of the present application, a first substrate 100 includes a display region 121 of the display panel and a non-display region 122 of the display panel outside the display region 121. A dashed line in FIG. 1 indicates a boundary line 123 between the display region 121 and the non-display region 122.

First Embodiment

Please refer to FIGS. 2 to 8 for structural diagrams of manufacturing processes of a first embodiment of the present application.

Figure 2:
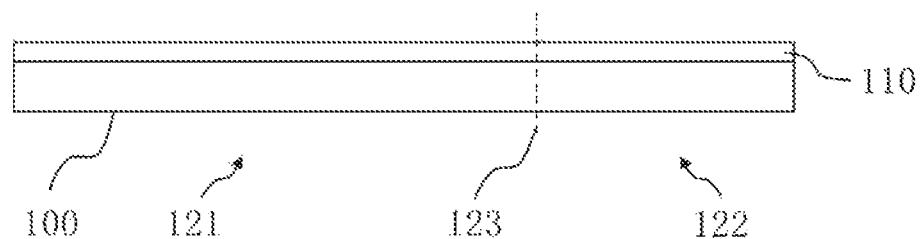
FIGS. 2 to 8 are structural diagrams of manufacturing processes of a first embodiment of the present application.

First, please refer to FIG. 2. Step S10 is providing the first substrate 100 as above described. The first substrate 100 can be an array substrate of the display panel, which is not limited in the present application. The first substrate 100 includes not only the display region 121, the non-display region 122, and the boundary line 123, but also a thin-film transistor 110.

Figure 3:
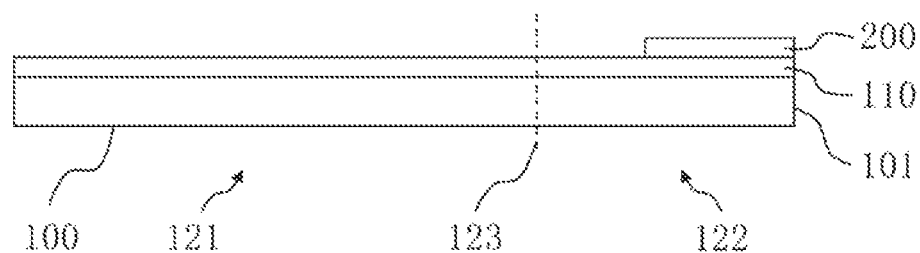

Please refer to FIG. 3. Step S20 is forming a plurality of bonding pads 200 on the non-display region 122 of the first substrate 100. The plurality of bonding pads 200 are electrically connected to the thin-film transistor 110 and extend to a side 101 of the first substrate 100. The plurality of bonding pads 200 are circuit pins of the thin-film transistor 110.

Figure 4:
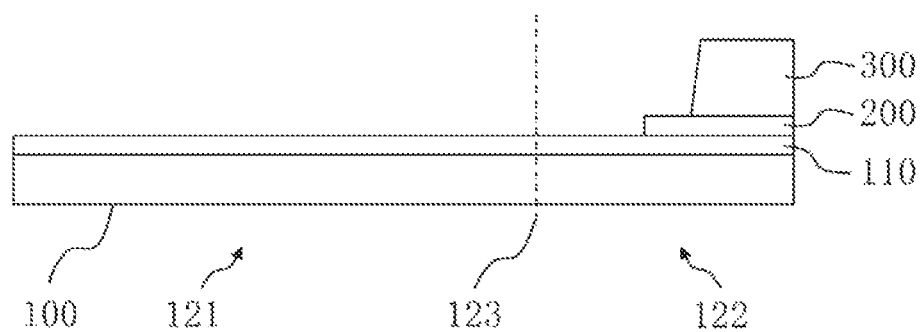

Please refer to FIG. 4. Step S30 is coating an insulating adhesive 300 on the plurality of bonding pads 200. The insulating adhesive 300 is configured to protect and insulate the plurality of bonding pads 200. The insulating adhesive 300 in the present application is tuffy blue glue, and can be other insulating coatings, UV curing glue, or silicone, which is not limited in the present application.

Figure 5:
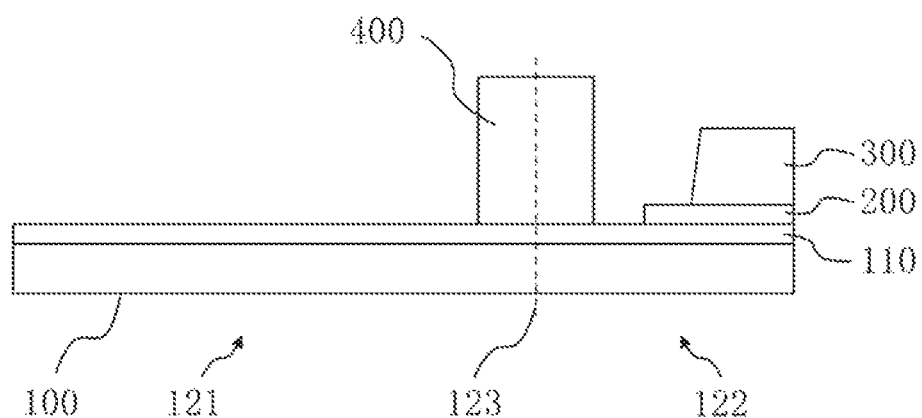

Please refer to FIG. 5. Step S40 is coating a sealant 400 on the first substrate 100 along a boundary line 123 between the display region 121 and the non-display region 122. The sealant 400 is a frame sealant of the display panel and is configured to surround the display region 121 to facilitate liquid crystal filling in subsequent processes.

Figure 6:
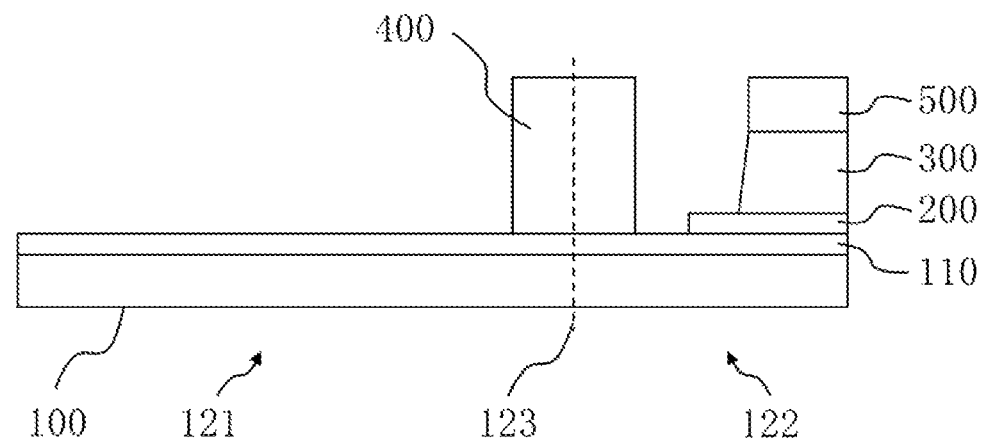

Please refer to FIG. 6. Step S50 is forming a blocking layer 500 on the insulating adhesive 300. The step S50 further includes step S51: coating a polystyrene (PS) layer on the insulating adhesive 300 to form the blocking layer 500. Because each of the plurality of bonding pads 200 has a certain thickness, profiles between each of the plurality of bonding pads 200 are low. The insulating adhesive 300 coated in the step S30 is only configured to protect and insulate the plurality of bonding pads 200, and a surface of the insulating adhesive 300 after coating is still uneven. Therefore, a main purpose of this step is to flatten the insulating adhesive 300.

Figure 7:
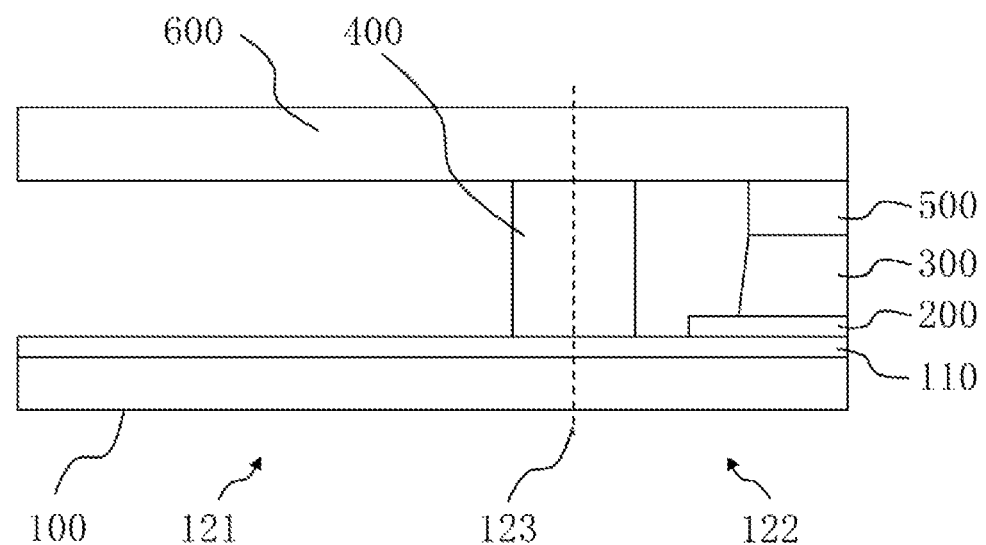

Please refer to FIG. 7. Step S60 is disposing a second substrate 600 on the sealant 400. The second substrate 600 can be a color filter substrate of the display panel, which is not limited in the present application.

Figure 8:
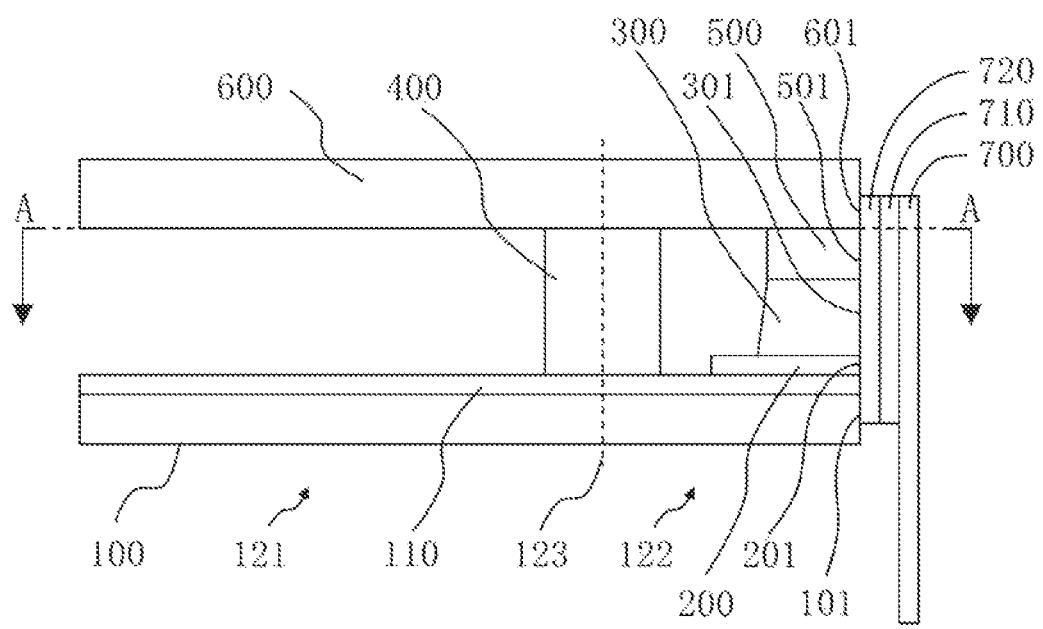

Please refer to FIG. 8. Step S70 is attaching a chip on film (COF) 700 on the side 101 of the first substrate 100, a side 201 of the plurality of bonding pads 200, a side 301 of the insulating adhesive 300, a side 501 of the blocking layer 500, and a side 601 of the second substrate 600, which are coplanar. The side 101 of the first substrate 100, the side 201 of the plurality of bonding pads 200, the side 301 of the insulating adhesive 300, the side 501 of the blocking layer 500, and the side 601 of the second substrate 600 form an edge of the display panel. The edge of the display panel can be formed into a flat surface by a machining method such as grinding or cutting.

The COF 700 includes an anisotropic conductive film 710 coated with a conductive adhesive 720. The COF 700 is bonded to the side 201 of the plurality of bonding pads 200 through the conductive adhesive 720 and the anisotropic conductive film 710. Each of the plurality of bonding pads 200 is electrically connected to a corresponding circuit on the COF 700, and is then electrically connected to a driving circuit of the display panel to complete a side-bonding structure of the display panel. The conductive adhesive 720 in the present application is a silver paste, which can have a conductive effect and an adhesive effect after it is cured or dried. The conductive adhesive 720 can be other conductive paint, copper paste, or resin with conductive powder, which is not limited in the present application.

The display panel manufactured by the above processes includes: the first substrate 100 including the thin-film transistor 110, the display region 121, and the non-display region 122; the plurality of bonding pads 200 disposed on the non-display region 122 of the first substrate 100; the insulating adhesive 300 coated on the plurality of bonding pads 200; the sealant 400 coated on the first substrate 100; the blocking layer 500 disposed on the insulating adhesive 300; the second substrate 600 disposed on the sealant 400; and the COF 700 disposed on the side 101 of the first substrate 100, the side 201 of the plurality of bonding pads 200, the side 301 of the insulating adhesive 300, the side 501 of the blocking layer 500, and the side 601 of the second substrate 600, which are coplanar.

Figure 9:
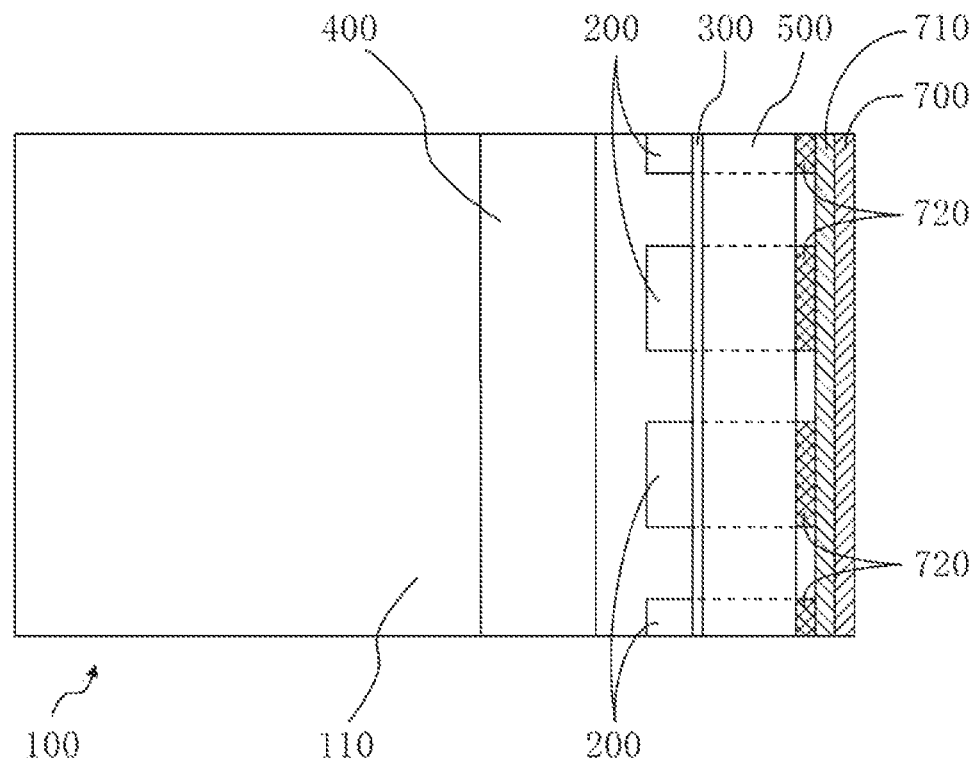
FIG. 9 is a cross-sectional view A-A in FIG. 8.

Please refer to FIG. 9. FIG. 9 is a cross-sectional view A-A in FIG. 8, which shows the cross-sectional view from top of the display panel. When the COF 700 is bonded, the blocking layer 500 prevents the conductive adhesive 720 from overflowing to a direction to the insulating adhesive 300, thereby preventing the conductive adhesive 720 from causing short circuits between each of the plurality of bonding pads 200 and effectively increasing process yield.

Second Embodiment

Manufacturing processes of the second embodiment of the present application are similar to that of the first embodiment, and have same steps S10 to S50 as in the first embodiment.

Figure 10:
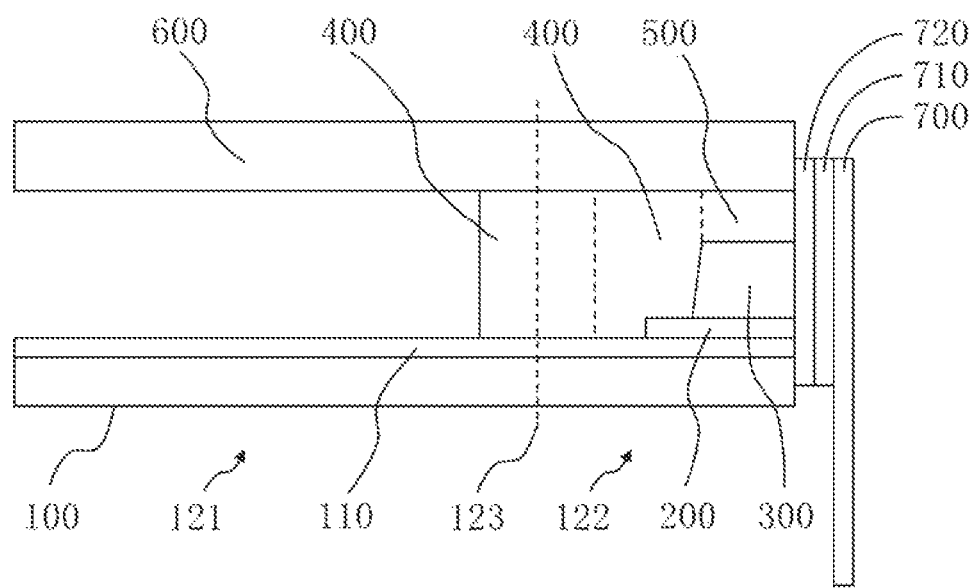
FIG. 10 is a structural diagram of a second embodiment of the present application.

Please refer to FIG. 10. The step S50 further includes step S51: coating the sealant 400 of step S40 on the insulating adhesive 300 to form the blocking layer 500 and cover the non-display region 122. Then, same steps S60 and S70 are performed as in the first embodiment.

In the step S51 of the second embodiment of the present application, the sealant 400 of the step S40 is continuously coated on the first substrate 100 from the boundary line 123 between the display region 121 and the non-display region 122 to the insulating adhesive 300 and covers the non-display region 122. A configuration of the step S51 prevents the conductive adhesive 720 from overflowing to the direction to the insulating adhesive 300, thereby preventing the conductive adhesive 720 from causing short circuits between each of the plurality of bonding pads 200. In addition, a formation of the blocking layer 500 is simplified.

The display panel manufactured by the above processes includes: the first substrate 100 including the thin-film transistor 110, the display region 121, and the non-display region 122; the plurality of bonding pads 200 disposed on the non-display region 122 of the first substrate 100; the insulating adhesive 300 coated on the plurality of bonding pads 200; the sealant 400 coated on the first substrate 100; the blocking layer 500 disposed on the insulating adhesive 300 and integrated with the sealant 400; the second substrate 600 disposed on the sealant 400; and the COF 700 disposed on the side 101 of the first substrate 100, the side 201 of the plurality of bonding pads 200, the side 301 of the insulating adhesive 300, the side 501 of the blocking layer 500, and the side 601 of the second substrate 600, which are coplanar.

Although the present application has been disclosed above with the preferred embodiments, it is not intended to limit the present application. Persons having ordinary skill in this technical field can still make various alterations and modifications without departing from the scope and spirit of this application. Therefore, the scope of the present application should be defined and protected by the following claims and their equivalents.

What is claimed is:

1. A display panel, comprising:
a first substrate comprising a thin-film transistor, a display region, and a non-display region outside the display region;
a plurality of bonding pads disposed on the non-display region of the first substrate, wherein the plurality of bonding pads are electrically connected to the thin-film transistor and extend to a side of the first substrate;
an insulating adhesive coated on the plurality of bonding pads;
a sealant coated on the first substrate along a boundary line between the display region and the non-display region;
a blocking layer disposed on the insulating adhesive;
a second substrate disposed on the sealant; wherein the side of the first substrate, a side of the plurality of bonding pads, a side of the insulating adhesive, a side of the blocking layer, and a side of the second substrate are coplanar; and
a chip on film (COF) disposed on the side of the first substrate, the side of the plurality of bonding pads, the side of the insulating adhesive, the side of the blocking layer, and the side of the second substrate, which are coplanar;
wherein the COF comprises an anisotropic conductive film coated with a conductive adhesive, the COF is bonded to the side of the plurality of bonding pads through the conductive adhesive and the anisotropic conductive film, and each of the plurality of bonding pads is electrically connected to a corresponding circuit on the COF; and
wherein when the COF is bonded to the side of the plurality of bonding pads, the blocking layer prevents the conductive adhesive from overflowing and makes a circuit of each of the plurality of bonding pads be insulated from each other.

2. The display panel as claimed in claim 1, wherein the side of the first substrate, the side of the plurality of bonding pads, the side of the insulating adhesive, the side of the blocking layer, and the side of the second substrate comprise a flat surface.

3. The display panel as claimed in claim 1, wherein the blocking layer is a polystyrene layer.

4. The display panel as claimed in claim 3, wherein the insulating adhesive is a tuffy blue glue.

5. The display panel as claimed in claim 3, wherein the conductive adhesive is a silver paste.

6. The display panel as claimed in claim 1, wherein material of the blocking layer is same as material of the sealant, and the sealant covers the non-display region.

7. The display panel as claimed in claim 6, wherein the insulating adhesive is a tuffy blue glue.

8. The display panel as claimed in claim 6, wherein the conductive adhesive is a silver paste.

9. A manufacturing method of a display panel, comprising the steps of:
step S10: providing a first substrate comprising a thin-film transistor, a display region, and a non-display region outside the display region;
step S20: forming a plurality of bonding pads on the non-display region of the first substrate, wherein the plurality of bonding pads are electrically connected to the thin-film transistor and extend to a side of the first substrate;
step S30: coating an insulating adhesive on the plurality of bonding pads;
step S40: coating a sealant on the first substrate along a boundary line between the display region and the non-display region;
step S50: forming a blocking layer on the insulating adhesive;
step S60: disposing a second substrate on the sealant;

wherein the side of the first substrate, a side of the plurality of bonding pads, a side of the insulating adhesive, a side of the blocking layer, and a side of the second substrate are coplanar; and step S70: attaching a chip on film (COF) on the side of the first substrate, the side of the plurality of bonding pads, the side of the insulating adhesive, the side of the blocking layer, and the side of the second substrate, which are coplanar;

wherein the COF comprises an anisotropic conductive film coated with a conductive adhesive, the COF is bonded to the side of the plurality of bonding pads through the conductive adhesive and the anisotropic conductive film, and each of the plurality of bonding pads is electrically connected to a corresponding circuit on the COF; and wherein when the COF is bonded to the side of the plurality of bonding pads, the blocking layer prevents the conductive adhesive from overflowing and makes a circuit of each of the plurality of bonding pads be insulated from each other.

10. The manufacturing method of the display panel as claimed in claim 9, wherein the side of the first substrate, the side of the plurality of bonding pads, the side of the insulating adhesive, the side of the blocking layer, and the side of the second substrate are grinded or cut to form a flat surface.

11. The manufacturing method of the display panel as claimed in claim 9, wherein the step S50 further comprises the step of:

step S51: coating a polystyrene layer on the insulating adhesive to form the blocking layer.

12. The manufacturing method of the display panel as claimed in claim 11, wherein the insulating adhesive is a tuffy blue glue.

13. The manufacturing method of the display panel as claimed in claim 11, wherein the conductive adhesive is a silver paste.

14. The manufacturing method of the display panel as claimed in claim 9, wherein the step S50 further comprises the step of:

step S51: coating the sealant of step S40 on the insulating adhesive to form the blocking layer and cover the non-display region.

15. The manufacturing method of the display panel as claimed in claim 14, wherein the insulating adhesive is a tuffy blue glue.

16. The manufacturing method of the display panel as claimed in claim 14, wherein the conductive adhesive is a silver paste.

* * * * *